(12) United States Patent
Kornilovich (10) Patent No.: US 6,858,162 B2
(45) Date of Patent: Feb. 22, 2005

(54) SINGLE MOLECULE REALIZATION OF THE SWITCH AND DOIDE COMBINATION

(75) Inventor: Pavel Kornilovich, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 398 days.

(21) Appl. No.: 10/114,410

(22) Filed: Apr. 1, 2002

(65) Prior Publication Data

US 2003/0183847 A1 Oct. 2, 2003

(51) Int. Cl.$^7$ .......................... H01B 1/00; H01L 27/00; H01L 51/20; G11C 13/02; C07D 218/08
(52) U.S. Cl. ........................ 252/500; 257/200; 257/40; 438/6; 438/99; 546/104
(58) Field of Search .......................... 252/500; 257/40, 257/200; 438/6, 99; 546/104

(56) References Cited

U.S. PATENT DOCUMENTS

| | | | |
|---|---|---|---|
| 5,589,692 A | * 12/1996 | Reed | 257/23 |
| 6,339,227 B1 | * 1/2002 | Ellenbogen | 257/40 |
| 6,512,119 B2 | * 1/2003 | Bratkovski et al. | 546/104 |
| 6,663,797 B2 | * 12/2003 | Bratovski et al. | 252/500 |

OTHER PUBLICATIONS

U.S. Appl. No. 09/759,438,"Bistable Molecular Mechanical Device with an Appended Rotor Activated by an Electric Field for Electronis Swiching, Gating and Memory Applications," Bratkovski, et al., filed Jan. 12, 2001.

\* cited by examiner

*Primary Examiner*—Yogendra N. Gupta
*Assistant Examiner*—Kallambella Vijayakumar

(57) ABSTRACT

Diodes and switches are combined in a single molecular species. Thus, the single molecular species is capable of performing more than one function. A single molecular species having both diode and switch functionalities is provided. The molecular species is represented by the formula:

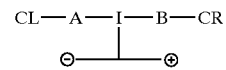

where A and B are non-identical conducting moieties, I is an insulating bridge between A and B, CL and CR are connectors to left and right electrodes, respectively, and "+" and "−" represent a rotatable dipolar moiety. Further, a diode-switch combination is provided, comprising the single molecular species. The teachings herein provide a set of principles to combine diodes and switches within one molecular species. Further, with the present teachings, only a single molecular species is needed for the fabrication of viable moletronic devices such as crossbar memory arrays. Consequently, device fabrication is easier and cheaper, and the device itself less faulty and more reliable.

36 Claims, 4 Drawing Sheets

SINGLE MOLECULE REALIZATION OF THE SWITCH AND DOIDE COMBINATION

TECHNICAL FIELD

The present invention relates generally to nanoscale devices, and, more particularly to nanoscale devices utilizing switching molecules.

BACKGROUND ART

The emerging field of molecular electronics holds the promise for ultimate miniaturization of computer memory and logic circuits down to nanometer size. At nanoscale dimensions, electronic circuit elements cannot be fabricated by conventional photolithographic methods, as is well-known. Moreover, the conventional principles of transporting, amplifying, and switching currents do not work anymore. Molecular electronics (moletronics) has to provide molecular-size replacements for various elements of semi-conductor electronics.

Traditionally, moletronic solutions have been focused on finding single-molecule wires, diodes, switches, transistors, and so on, that are on elements that could perform single electronic functions. However, most of memory and logic designs require combinations of two or more functions being performed simultaneously. For instance, a viable crossbar memory architecture contains a combination of a switch and a diode in series connection at every bit (crossbar junction). The same diode-switch combination is a necessary element for reconfigurable computer logic architectures.

Previously, the creation of such a combination was perceived to be simple addition. For instance, one could use two molecular layers, wherein one layer would contain switches and another layer diodes. However, this would make the device fabrication more difficult. More importantly, in such a design, one molecular layer is likely to interfere with another, which may spoil useful electronic properties of both layers. The device becomes more faulty, less reliable, and more expensive to build.

Thus, there is a need to provide circuit elements that utilize a single molecular species. In particular, there is a need to provide single molecular species that can perform more than one function.

DISCLOSURE OF INVENTION

In accordance with the embodiments disclosed herein, diodes and switches are combined in a single molecular species. Thus, the single molecular species is capable of performing more than one function.

In one embodiment, a single molecular species having both diode and switch functionalities is provided. The molecular species is represented by the formula:

where A and B are non-identical conducting moieties, I is an insulating bridge between A and B, CL and CR are connectors to left and right electrodes, respectively, and the "+" and "−" represent a dipolar moiety.

Further in accordance with another embodiment, a diode-switch combination is provided, comprising the single molecular species.

Further in accordance with yet another embodiment, a crossbar switch is provided. The crossbar switch comprises a first plurality of substantially parallel wires and a second plurality of substantially parallel wires. The second plurality of wires crosses the first plurality of wires to form a plurality of junctions, with each junction formed where one wire crosses another. There is a functional diode-switch combination at each junction.

The teachings herein provide a set of principles to combine diodes and switches within one molecular species. Further, with the present teachings, only a single molecular species is needed for the fabrication of viable moletronic devices such as crossbar memory arrays. Consequently, device fabrication is easier and cheaper, and the device itself less faulty and more reliable.

BRIEF DESCRIPTION OF THE DRAWINGS

FIG. 4c depicts full I-V characteristics.

BEST MODES FOR CARRYING OUT THE INVENTION

There are several design principles that are employed in the teachings herein. The switching mechanism is adopted from a previous invention entitled "Bistable Molecular Mechanical Device with an Appended Rotor Activated by an Electric Field for Electronic Switching, Gating and Memory Applications", filed in the names of Alexandre M. Bratkovski et al, Ser. No. 09/759,438, filed Jan. 12, 2001, now U.S. Pat. No. 6,512,119, issued Jan. 28, 2003, and assigned to the same assignee as the present application, the contents of which are incorporated herein by reference. In that patent application, nanometer-scale reversible electronic switches are provided that can be assembled to make crossbar circuits that provide memory, logic, and communications functions. The electronic switches, or crossed-wire devices, comprise a pair of crossed wires that form a junction where one wire crosses another at an angle other than zero degrees and at least one connector species connecting the pair of crossed wires in the junction. The junction has a functional dimension in nanometers. The connector species comprises a bistable molecule having a general formula given by where the letters in Formula (I) are defined as follows:
A=CH; N; C-alkyl; C-halogen; C—OH; C—OR(ether); C—SR(thioether); C-amide; C-ester or thioester;
B=CH; N; C-alkyl; C-halogen;; C—OH; C—OR(ether); C—SR(thioether); C-amide; C-ester or thioester;
D=CH; N; C-alkyl; C-halogen; C—OH; C—OR(ether); C—SR(thioether); C-amide; C-ester or thioester;
E=CH; N; C-alkyl; C-halogen; C—OH; C—OR(ether); C—SR(thioether); C-amide; C-ester or thioester;
F=CH; N; C-alkyl; C-halogen; C—OH; C—OR(ether); C—SR(thioether); C-amide; C-ester or thioester;
G=CH; N; C-alkyl; C-halogen; C—OH; C—OR(ether); C—SR(thioether); C-amide; C-ester or thioester;
J=CH; N; C-alkyl; C-halogen; C—OH; C—OR(ether); C—SR(thioether); C-amide; C-ester or thioester;
K=CH; N; C-alkyl; C-halogen; C—OH; C—OR(ether); C—SR(thioether); C-amide; C-ester or thioester;
M=$CH_2$; $CF_2$; $CCl_2$; $CHOCH_3$; CHOH; CHF; CO; CH=CH; $CH_2$—$CH_2$; S; O; NH; NR; NCOR; or NCOAr;
Q=CH; nitrogen; phosphorus; or boron;
Y=O or S; and
Z=R (H; alkyl); NHR; OR; SR; CHR—NHR; CHR—OR; CHR—SR; CHR—X (halogen); NR—NHR; NR—OR; or NR—SR.

The foregoing bistable molecules evidence high switching speed. Such molecules are essentially stable against switching due to thermal fluctuations.

Figure 1:
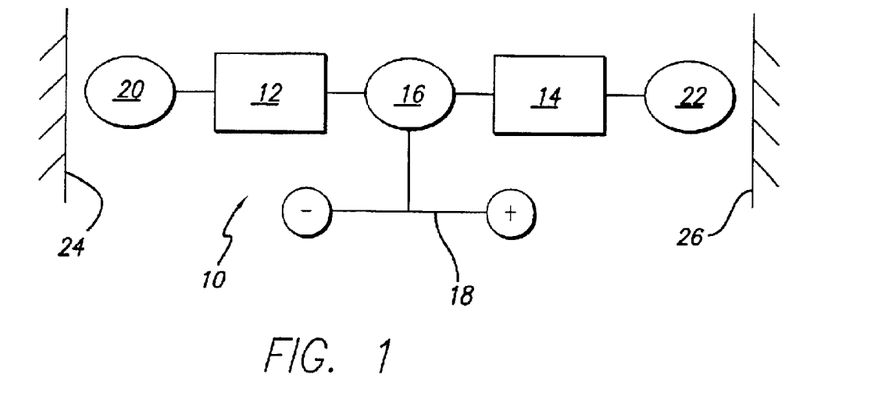
FIG. 1 is a schematic structure depicting an embodiment of a single-molecule diode-switch combination.

The remaining principles used herein are original with the present inventor. The structural form of the molecular species that realizes a switch plus diode combination electronic function, is shown in FIG. 1. The diode-switch molecule 10 consists of two non-identical conducting parts, or moieties, 12 and 14, an insulating bridge 16 between them, and an appended dipole 18. Side groups 20 and 22 provide chemical connections to the left electrode 24 and the right electrode 26, respectively. By "conducting" is meant that the molecule, or molecular moiety, in its conducting state, has a relatively small band gap. Such small band gap molecules include conjugated aromatics, such as benzene and naphthalene, and conjugated hydrocarbon chains, such as polyacetylenes. By "insulating" is meant that the molecule, or molecular moiety, in its insulating state has a relatively large band gap. Such large band gap molecules include saturated hydrocarbons, both cyclic and acyclic.

Dipole 18 is switchable between two positions ("bistable") with respect to the rest of the molecule. (The second state has "+" and "−" of the dipole inter-changed in FIG. 1.)

Hydrogen bonding between at least one atom, usually oxygen, on the dipole 18 and hydrogen atoms on moieties 12 and 14 make the symmetric orientation of the dipole 18 unstable. As a result, the molecule 10 is always in one of the two low-energy states that have opposite orientations of the dipole 18 with respect to the rest of the molecule. The molecule 10 can be switched between the two states with an external electric field, as described in the above-identified patent application Ser. No. 09/759,438.

A specific example of a molecular species with such a structure is shown in Structure 1a (State 1) and in Structure 1b (State 2).

Structure 1a

Structure 1a depicts an example of a combination molecule 10 in State 1. Dipole 18 is represented by an amide group —$CONH_2$, with the oxygen carbonyl (=O) being a "−", and the amide (—$NH_2$) being a "+". Conducting groups 12 and 14 are represented by naphthalene and benzene, respectively. Connection to the (gold) electrodes 24, 26 (not shown in Formula 1a) is provided by —$CH_2SH$ groups (side groups 20, 22). The three saturated hydrocarbon rings in the middle (tetradecahydroacridine) provide the required insulation (insulating bridge 16) between conducting groups 12 and 14.

Structure 1b

Structure 1b depicts the combination molecule 10 in State 2, where it can be seen that the dipole 18 has rotated 180 degrees with respect to its position in State 1.

The conducting groups 12 and 14 are characterized by relatively small HOMO-LUMO gaps (about 2 to 6 eV) and by the property that their HOMO, LUMO and neighboring molecular orbitals are delocalized and extend over substantially the entire length of the group. (The latter property ensures that the electron or hole is quickly transported across the group, hence good conduction.) The conducting groups 12, 14 may comprise conjugated hydrocarbons and aromatic homo- and hetero-carbocycles. Examples of conducting units are shown below.

-continued

Additionally, the conducting groups 12, 14 may be modified by attaching thereto various side groups such as alkanes, e.g., —CH$_3$, or other functional groups, e.g., —NH$_2$, —NO$_2$, —CN, —OH, —COOH, or —NO. An important design feature of the present embodiments is the non-equivalence of the conducting groups 12 and 14. Specifically, they should have different energies of their respective LUMOs. Preferably, the minimum energy separation between the LUMOs of the conducting groups 12 and 14 is 0.1 eV.

The insulating group 16 is characterized by a relatively large HOMO-LUMO gap (about 6 to 10 eV). The insulating group 16 may comprise saturated hydrocarbons, either cyclic or acyclic. Examples of insulating groups 16 are shown below.

The insulating moiety 16 may be further modified by attaching thereto various side groups such as alkanes, e.g., —CH$_3$, or other functional groups, e.g., —NH$_2$, —NO$_2$, —CN, —OH, —COOH, or —NO. The important property of the insulating bridge 16 is that it provides sufficient electrical insulation between the two conducting moieties 12 and 14 that it connects. By "sufficient electrical insulation" is meant that hybridization between molecular orbitals of the two conducting moieties 12, 14 is small, less that 1%. This ensures that the orbitals' energies will change independently under the influence of the electric field of the dipolar group 18. The required insulation is achieved by appropriate selection of the length of the insulating bridge 16; such appropriate selection is considered to be well within the ability of the person skilled in this art without undue experimentation.

The dipole 18 has a large dipole moment, >4 Debye. This may be achieved by using a moiety with an electron donor and acceptor attached to its opposite sides. The dipole 18 may alternatively be in zwitterion form. The dipole 18 should also have a strongly localized negative pole, usually due to one or more oxygen atoms, to form hydrogen bonds with the stationary part of the diode-switch molecule 10. The last important property of the dipole 18 is its connection to the rest of the molecule 10 through either a single or a triple bond that ensures a low energy barrier to dipole's rotation. Examples of the dipolar group 18 are shown below:

The side, or connector, groups 20, 22 provide connection to the electrodes 24, 26. Therefore, their choice is not independent but should be coordinated with the material of the electrodes 24, 26 as well as with the method of device preparation. For instance, in case of self-assembly on gold, silver, or other noble metals, the side groups 20, 22 may be thiols, or thiol-terminated alkenes. In case of Langmuir-Blodgett assembly, the side groups 20, 22 may be —COOH— terminated chains or groups. Examples are shown below.

The electrodes 24 and 26 may be metallic or semiconductor. The choice of material is dictated by the device fabrication process, chemical compatibility with the molecular species, and the value of the work function. The work function determines the position of the electrode Fermi level relative to the molecular LUMO and consequently the parameter Δ. The use of two different electrodes on both sides of the molecule is also contemplated within the scope of the embodiments disclosed herein.

Figure 2:
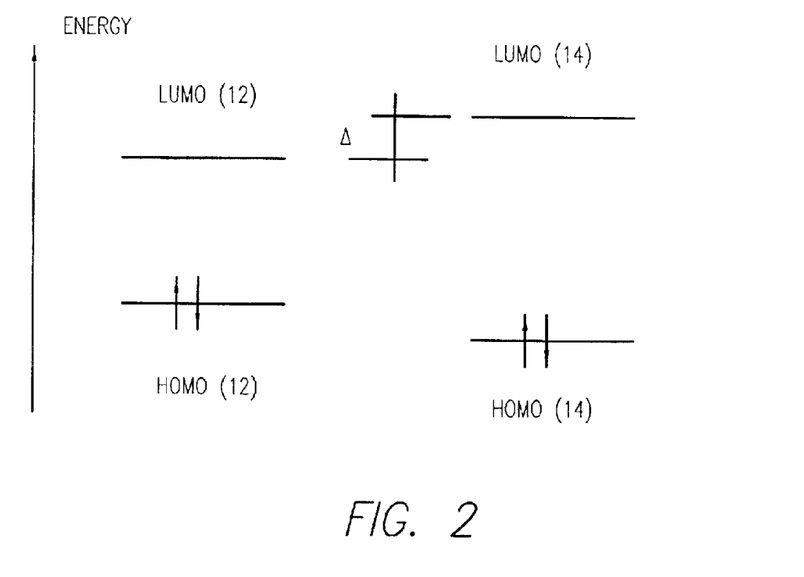
FIG. 2 is an energy structure of the molecule employed in the combination of FIG. 1 in the absence of a dipole appended to the molecule.

Additional examples of single-molecule diode-switch 10 combinations are shown below:

As mentioned above, one main feature of the embodiments herein is the difference between the two conducting moieties 12 and 14. The presence of the insulating bridge 16 renders the electronic systems of moieties 12 and 14 almost independent of each other. Since the conducting moieties 12 and 14 are different, their respective electronic structures are different as well. In particular, conducting moieties 12 and 14 have their respective highest occupied molecular orbitals (HOMO) and lowest unoccupied molecular orbitals (LUMO) lying at different energies; in this connection, see FIG. 2, which depicts the energy structure of the molecule 10 in the absence of dipole 18. The energy difference between the two LUMOs, $\Delta$, is an important characteristic of the molecular diode-switch combination.

Now consider the effect that dipole 18 has on the energy structure of the molecule. Since the dipole 18 is positioned asymmetrically with respect to the conducting moieties 12 and 14, it will be shifting the energy levels of the conducting moieties in the opposite directions. Moreover, the shifts will have different signs in States 1 and 2. Thus, the energy difference $\Delta$ between the LUMOs of moieties 12 and 14 will be decreased in State 1 but increased in State 2. An essential requirement of the present design is that the energy shift due to the dipole has to be comparable with the initial energy difference $\Delta$. By "comparable" is meant that the value is within 0.1 to 1.0 of $\Delta$.

Consequently, the energy difference between the LUMOs of moieties 12 and 14 will be substantially different in States 1 and 2. Typical energy shifts in such molecules due to the dipole 18 are about 0.2 to 0.3 eV. Typical initial energy differences between LUMOs are $\Delta \approx 1$ eV. (For instance, the HOMO-LUMO gap for benzene is about 6.8 eV and for naphthalene is about 4.6 eV which yields $\Delta=1.2$ eV.) For simplicity, one can use 0.25 eV for the dipole-induced shift and $\Delta=1.0$ eV. Then, in State 1, $\Delta$ will be decreased by half and in State 2 it will be increased by half; in this connection, see FIG. 3.

Figure 3A:
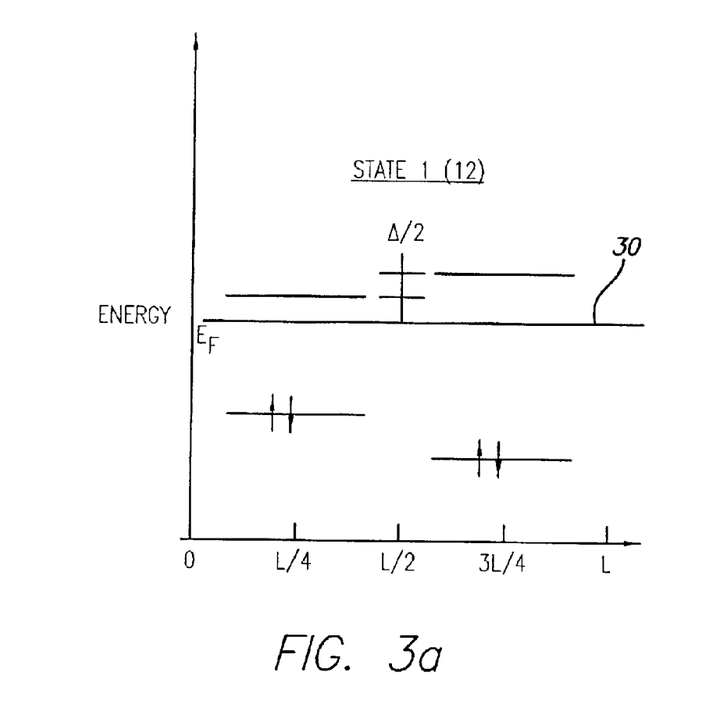
FIGS. 3a–3b are each an energy structure similar to that of FIG. 2, but in the presence of a dipole appended to the molecule, depicting the energy structure of the dipole in a first state (FIG. 3a) and in a second state (FIG. 3b)
Figure 3B:
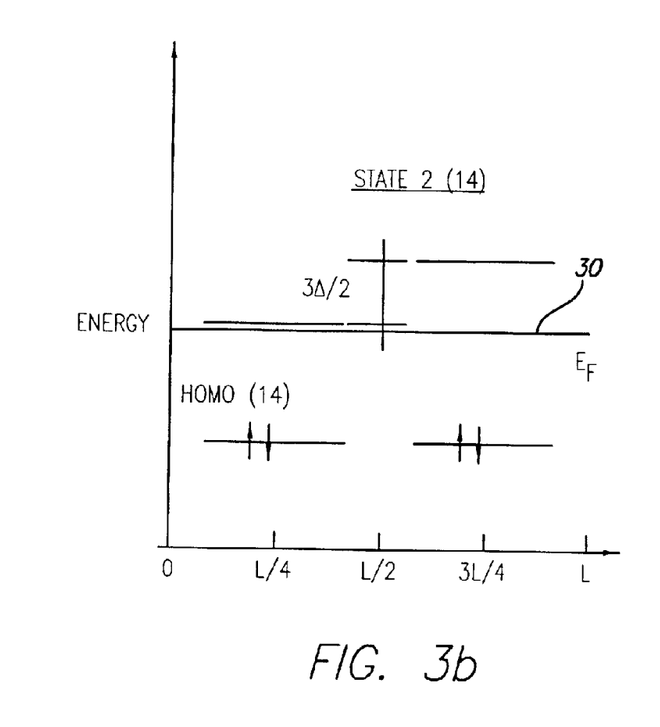

In FIGS. 3a–3b, the energy structure of the molecule in the presence of dipole 18 is depicted. FIG. 3a depicts State 1, while FIG. 3b depicts State 2. It will be noted that the energy difference between the LUMOs in State 1 is significantly smaller than in State 2, in this case, by a factor of three. Horizontal line 30 indicates the position of the Fermi levels of electrodes 24, 26 (in general, the chemical potential of the electrodes). The Fermi level 30 must be close to the LUMOs. The location of the up-down arrows along the x-axis indicates the distance along the length of the molecule, with L being its full length.

The next main feature of the embodiments herein is the use of electrodes, metallic or semiconducting, whose Fermi energies (in general, chemical potentials) lie close to the LUMOs. In this context, "close" means comparable with $\Delta$, here, within 1.0 and 3.0 of $\Delta$. It is assumed that the mutual position of the Fermi levels of electrodes 24 and 26 and the LUMOs of moieties 12 and 14 can be fine tuned by changing the materials comprising the electrodes 24, 26 and the doping level as well as the structure and constituent parts of moieties 12 and 14. It will be noted that typical work functions (minus $E_F$) of metals are 2 to 5 eV; these values are close to the affinities of conjugated carbocycles, e.g., aromatics (that is, minus the energy of the LUMOs). At the same time, ionization energies of the aromatics are about 8 to 10 eV (that is, minus the energy of HOMOs). Thus, an analogous situation where the Fermi levels 30 lie close to the HOMOs, seems to be highly unlikely.

Consider now the current-voltage (I-V) characteristics of the electrode—molecule—electrode junction in the two molecular states. Two important factors affect the shape of the I-V characteristics. These are: (i) electric current has predominantly resonant-tunneling character, and (ii) at a non-zero external bias, the energy levels (LUMOs, HOMOs, etc) shift with respect to each other because of an approximately linear drop of the electrostatic potential between the electrodes 24, 26. The left electrode 24 is assumed to be grounded.

Consider State 1 under forward bias V>0. That means the electron levels of the right electrode 26 decrease by V. Accordingly, the molecular energy levels decrease as well by an amount roughly proportional to the distance between this part of the molecule and the left electrode 24. At a voltage $V \approx \Delta/|e| \approx 1$ volt, the energies of the LUMOs of moieties 12 and 14 coincide and the condition of resonant tunneling through the entire length of the molecule 10 is satisfied. Thus, at this voltage, there is a sharp increase of current; see FIG. 4a. At still higher voltages, the current may drop because the two LUMOs are driven off resonance, or the current may continue to increase due to the presence of other higher-energy conducting molecular states. A precise high-voltage behavior of the I-V characteristic is not essential for the present embodiments.

Under reverse bias V<0, the two LUMOs move further apart from each other. As a result, the two LUMOs never line up, and the resonant tunneling condition is never satisfied for voltages $|V| \approx \Delta/|e|$. Thus, the molecule 10 remains a good insulator. The full I-V characteristic of State 1 is diode-like; see FIG. 4a. The current-voltage characteristic in State 2 is qualitatively similar to that in State 1, with an important difference that the LUMOs line up at a much larger forward bias $V \approx 3\Delta/|e| \approx 3$ volts due to a larger initial energy separation of the LUMOs. Under reverse bias, the junction remains insulating as in State 1; see FIG. 4b.

Figure 4A:
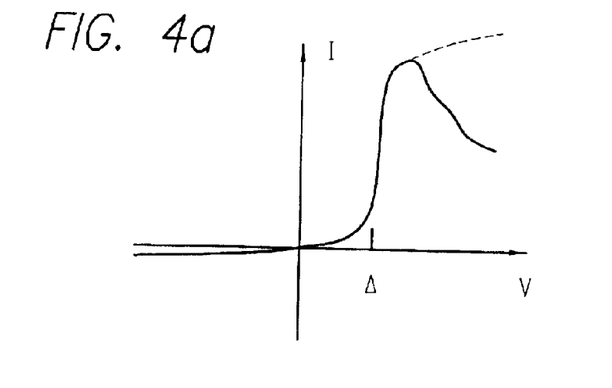
FIGS. 4a–4c, on coordinates of current (I) and voltage (V), depict the current-voltage characteristics of the electrode—molecule—electrode junction, wherein FIG. 4a (State 1) depicts diode-like I-V characteristics in which current begins at V~Δ/|e|, FIG. 4b (State 2) depicts diode-like I-V characteristics in which current begins at V~3Δ/|e|.
Figure 4B:
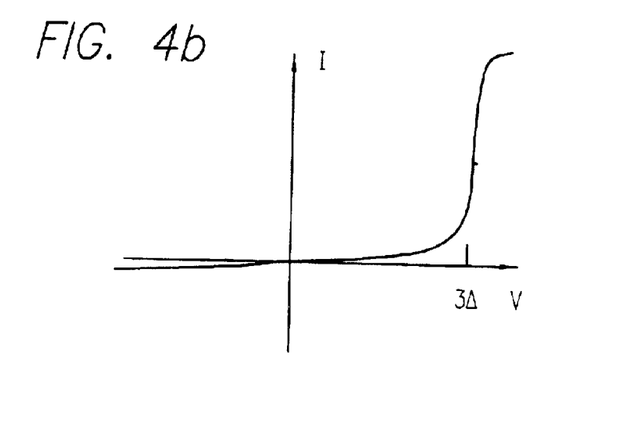

Summarizing FIGS. 4a–4b, FIG. 4a depicts for State 1 diode-like I-V characteristics, where the current begins at $V \approx \Delta/|e|$. FIG. 4b depicts for State 2 diode-like I-V characteristics where the current begins at $V \approx 3\Delta/|e|$.

Figure 4C:
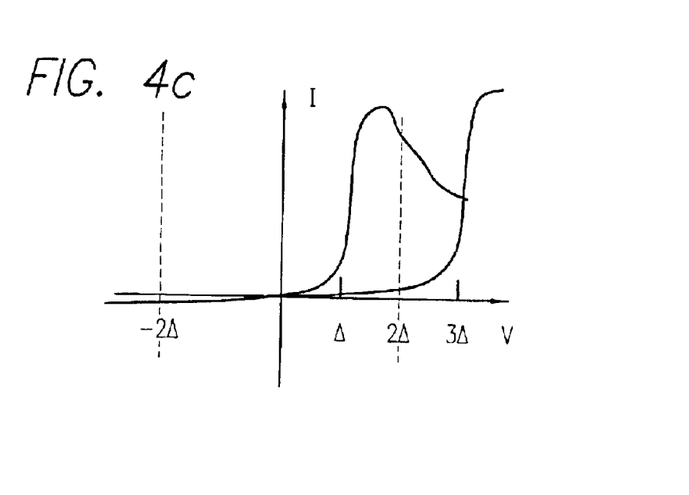

FIG. 4c depicts the full I-V characteristic of molecule 10. At $-2\Delta/|e| < V < 2\Delta/|e|$, the junction behaves as a diode-switch combination. Transitions between the two states occur at some higher voltages $|V| > 3\Delta/|e|$, when the electric field is strong enough to flip the dipole 18 between the two available states.

When the two I-V characteristics of FIGS. 4a–4b are combined, it is clear that there is a wide enough voltage interval when the junction behaves as a diode in State 1 and an insulator (open switch) in State 2. It is assumed that at some higher voltages |V|>3Δ/|e|, the external electric field is strong enough to be able to flip the dipole 18 between the two available states, thereby switching the junction between States 1 and 2. Thus, the junction behaves as a diode-switch combination.

Additional Considerations.

The electrodes 24, 26 may be the same or different. In the case of different electrodes 24, 26, this may be required from a fabrication viewpoint. Additionally, the difference in the work functions of the two materials could be used to adjust the parameter Δ: the work function difference creates an internal electric field on the molecule which results in shifting molecular orbitals with respect to the electrode Fermi level by a fraction of Δ.

The technology disclosed and claimed herein for forming diode-switch combinations may be used to perform a variety of functions and to form a variety of useful devices and circuits for implementing computing on a microscale and even on a nanoscale. For example, applications include molecular wire crossbar interconnects (MWCI) for signal routing and communications, molecular wire crossbar memory (U.S. Pat. No. 6,128,214), molecular wire crossbar logic (MWCL) employing programmable logic arrays, a demultiplexer for a molecular wire crossbar network, molecular wire transistors, and pixel arrays for displays.

Figure 5:
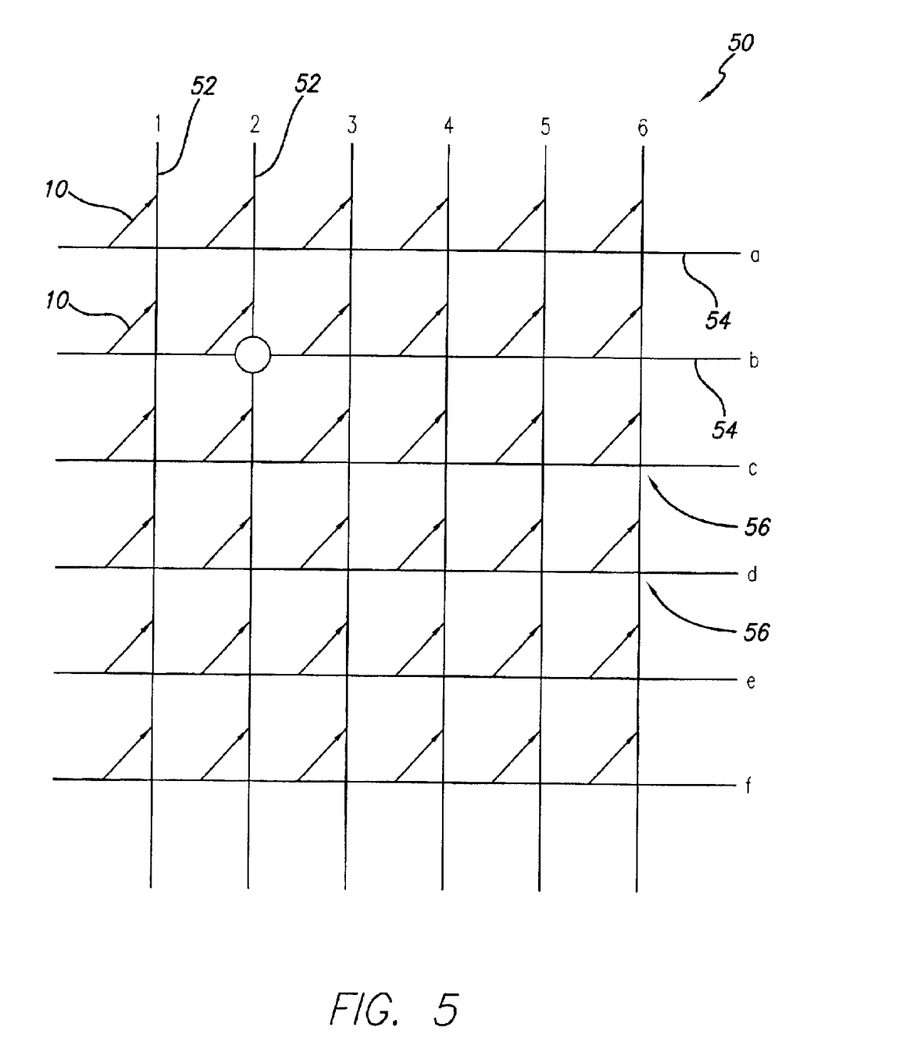
FIG. 5 is a schematic representation of a two-dimensional array of the diode-switches disclosed herein, depicting a 6×6 crossbar switch.

As illustrated in FIG. 5, the diode-switch 10 disclosed herein can be replicated in a two-dimensional array to form a plurality, or array, 50 of switches to form a crossbar switch. FIG. 5 depicts a 6×6 array 50, but the invention is not so limited to the particular number of elements, or diode-switches, in the array. The array comprises a plurality of vertical wires 52 and a plurality of horizontal wires 54. At each crossing of a wire 52 and a wire 54, a junction 56 is formed. Each junction has a functional diode-switch combination that is realized by one, several, or many molecules with diode-switching functionalities.

Access to a single point, e.g., 2b, is done by impressing voltage on wires 2 and b to cause a change in the state of the diode-switch 10 at the junction thereof 18, as described above. Thus, access to each junction 18 is readily available for configuring only those pre-selected junctions in accordance with the teachings herein. Details of the operation of the crossbar switch array 50 are further discussed in above-referenced U.S. Pat. No. 6,128,214.

INDUSTRIAL APPLICABILITY

There has been disclosed a single molecular species that functions as both a diode and a switch for nanometer-scale device applications.

What is claimed is:

1. A single molecular species having both diode and switch functionalities, said molecular species represented by the formula:

where A and B are non-identical conducting moieties, I is an insulating bridge between A and B, CL and CR are connectors to left and right electrodes, respectively, and "+" and "−" represent a rotatable dipolar moiety.

2. The molecular species of claim 1 wherein A and B both have a smaller band gap compared to I.

3. The molecular species of claim 2 wherein A and B each have a band gap within a range of about 2 to 6 eV.

4. The molecular species of claim 2 wherein I has a band gap within a range of about 6 to 10 eV.

5. The molecular species of claim 2 wherein A and B are independently selected from the group consisting of conjugated homo-cycle or hetero-cycle aromatics and conjugated hydrocarbon chains.

6. The molecular species of claim 2 wherein I is selected from the group consisting of saturated cyclic and acyclic hydrocarbons.

7. The molecular species of claim 1 wherein I provides sufficient electrical insulation between said two conducting moieties A and B such that hybridization between molecular orbitals of said two conducting moieties A, B is less that 1%.

8. The molecular species of claim 1 wherein said dipolar moiety contains at least one atom capable of hydrogen bonding to at least one hydrogen atom on said molecular species.

9. The molecular species of claim 1 wherein said dipolar moiety has a dipole moment >4 Debye.

10. The molecular species of claim 1 wherein said dipolar moiety is attached to said insulating bridge via a single bond or a triple bond.

11. The molecular species of claim 1 wherein said connectors CL, CR are selected from the group consisting essentially of thiols, thiol-terminated alkenes, and —COOH—terminated chains or groups.

12. The molecular species of claim 1 wherein said electrodes are the same or different and are either metallic or semiconductor.

13. A diode-switch combination comprising a single molecular species having both diode and switch functionalities, said molecular species represented by the formula:

where A and B are non-identical conducting moieties, I is an insulating bridge between A and B, CL and CR are connectors to left and right electrodes, respectively, and "+" and "−" represent a rotatable dipolar moiety.

14. The diode-switch combination of claim 13 wherein A and B both have a smaller band gap compared to I.

15. The diode-switch combination of claim 14 wherein A and B each have a band gap within a range of about 2 to 6 eV.

16. The diode-switch combination of claim 14 wherein I has a band gap within a range of about 6 to 10 eV.

17. The diode-switch combination of claim 13 wherein A and B are independently selected from the group consisting of conjugated homo-cycle or hetero-cycle aromatics and conjugated hydrocarbon chains.

18. The diode-switch combination of claim 13 wherein I is selected from the group consisting of saturated cyclic and acyclic hydrocarbons.

19. The diode-switch combination of claim 13 wherein I provides sufficient electrical insulation between said two conducting moieties A and B such that hybridization between molecular orbitals of said two conducting moieties A, B is less that 1%.

20. The diode-switch combination of claim 13 wherein said dipolar moiety contains at least one atom capable of hydrogen bonding to at least one hydrogen atom on said molecular species.

21. The diode-switch combination of claim 13 wherein said dipolar moiety has a dipole moment >4 Debye.

22. The diode-switch combination of claim 13 wherein said dipolar moiety is attached to said insulating bridge via a single bond or a triple bond.

23. The diode-switch combination of claim 13 wherein said connectors CL, CR are selected from the group consisting essentially of thiols, thiol-terminated alkenes, and —COOH—terminated chains or groups.

24. The diode-switch combination of claim 13 wherein said electrodes are the same or different and are either metallic or semiconductor.

25. A crossbar switch comprising a first plurality of substantially parallel wires and a second plurality of substantially parallel wires, said second plurality of wires crossing said first plurality of wires to form a plurality of junctions, with each junction formed where one wire crosses another, each said junction having a functional diode-switch combination comprising a single molecular species having both diode and switch functionalities, said molecular species represented by the formula:

where A and B are non-identical conducting moieties, I is an insulating bridge between A and B, CL and CR are connectors to left and right electrodes, respectively, and "+" and "−" represent a rotatable dipolar moiety.

26. The crossbar switch of claim 25 wherein A and B both have a smaller band gap compared to I.

27. The crossbar switch of claim 26 wherein A and B each have a band gap within a range of about 2 to 6 eV.

28. The crossbar switch of claim 26 wherein I has a band gap within a range of about 6 to 10 eV.

29. The crossbar switch of claim 25 wherein A and B are independently selected from the group consisting of conjugated homo-cycle or hetero-cycle aromatics and conjugated hydrocarbon chains.

30. The crossbar switch of claim 25 wherein I is selected from the group consisting of saturated cyclic and acyclic hydrocarbons.

31. The crossbar switch of claim 25 wherein I provides sufficient electrical insulation between said two conducting moieties A and B such that hybridization between molecular orbitals of said two conducting moieties A, B is less that 1%.

32. The crossbar switch of claim 25 wherein said dipolar moiety contains at least one atom capable of hydrogen bonding to at least one hydrogen atom on said molecular species.

33. The crossbar switch of claim 25 wherein said dipolar moiety has a dipole moment >4 Debye.

34. The crossbar switch of claim 25 wherein said dipolar moiety is attached to said insulating bridge via a single bond or a triple bond.

35. The crossbar switch of claim 25 wherein said connectors CL, CR are selected from the group consisting essentially of thiols, thiol-terminated alkenes, and —COOH—terminated chains or groups.

36. The crossbar switch of claim 25 wherein said electrodes are the same or different and are either metallic or semiconductor.

* * * * *